(12) United States Patent
Cho et al.

(10) Patent No.: US 11,277,144 B1
(45) Date of Patent: Mar. 15, 2022

(54) ANALOG-BASED DC OFFSET COMPENSATION

(71) Applicant: Xilinx, Inc., San Jose, CA (US)

(72) Inventors: Junho Cho, San Jose (CA); Parag Upadhyaya, Los Gatos, CA (US)

(73) Assignee: Xilinx, Inc., San Jose, CA (US)

(*) Notice: Subject to any disclaimer, the term of this patent is extended or adjusted under 35 U.S.C. 154(b) by 59 days.

(21) Appl. No.: 16/840,533

(22) Filed: Apr. 6, 2020

(51) Int. Cl.
*H03M 1/06* (2006.01)
*H03M 1/00* (2006.01)
*H03M 1/10* (2006.01)

(52) U.S. Cl.
CPC ............ *H03M 1/0607* (2013.01); *H03M 1/00* (2013.01); *H03M 1/1019* (2013.01); *H03M 1/1023* (2013.01)

(58) Field of Classification Search
CPC ............ H03M 1/0607; H03M 1/1023; H03M 1/1019; H03M 2201/2355; H03M 1/00
See application file for complete search history.

(56) References Cited

U.S. PATENT DOCUMENTS

RE34,428 E * 11/1993 George ............... H03M 1/0663
341/118

OTHER PUBLICATIONS

Zheng et al., "An Inverter-Based Analog Front End for a 56 Gb/s PAM4 Wireline Transceiver in 16nm CMOS," 2018 Symposium on VLSI Circuits Digest of Technical Papers, IEEE, pp. 269-270 (Year: 2018).

* cited by examiner

*Primary Examiner* — Joseph J Lauture
(74) *Attorney, Agent, or Firm* — Paradice and Li LLP

(57) ABSTRACT

An apparatus for reducing or removing a direct current (DC) offset voltage from one or more analog signals is disclosed. An analog signal may be received by an integrator. The integrator may integrate the analog signal to determine a DC offset error signal. The apparatus may integrate, invert, and amplify the DC offset error signal to provide an analog correction signal. The analog correction signal may be inverted and subtracted from the analog signal. In some implementations, the apparatus may include multiple, independent circuits to reduce or remove DC offset voltages from differential signals.

19 Claims, 4 Drawing Sheets

ANALOG-BASED DC OFFSET COMPENSATION

TECHNICAL FIELD

Aspects of the present disclosure generally relate to analog signals, and specifically to analog-based direct current (DC) offset compensation for analog signals.

BACKGROUND

Many electrical devices include analog circuits that receive and/or generate analog signals. For example, communications devices include a plurality of analog circuits to transmit and receive analog signals. In some implementations, the analog signals themselves may represent digital data. A noisy, distorted, or otherwise inaccurate analog signal may negatively affect performance of the electrical device. For example, an analog signal with a DC offset voltage may cause errors, such as decoding errors, which, in turn, may reduce signal bandwidth and degrade performance of the electrical device.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to an apparatus configured to reduce direct current (DC) offset voltage in an analog signal. In some implementations, the apparatus may include an integrator configured to generate an analog DC offset error signal based on a DC offset voltage of the analog signal, a first buffer configured to invert and amplify the analog DC error signal to generate an analog correction signal, and a second buffer configured to invert and subtract the analog correction signal to reduce the DC offset voltage in the analog signal.

Another apparatus is disclosed that may reduce a DC offset voltage in an analog differential signal. The apparatus may include a first integrator configured to generate a first analog DC offset error signal based on a first DC offset voltage of a first analog differential signal, a first buffer configured to invert and amplify the first analog DC offset error signal to generate a first analog correction signal, and a second buffer configured to invert and subtract the first analog correction signal from the first analog differential signal. The apparatus also may include a second integrator configured to generate a second analog DC offset error signal based on a second DC offset voltage of a second analog differential signal, a third buffer configured to invert and amplify the second analog DC offset error signal to generate a second analog correction signal, and a fourth buffer configured to invert and subtract the second analog correction signal from the second analog differential signal to reduce the second DC offset voltage from the second analog differential signal.

Another apparatus is disclosed that may include a means for generating an analog DC offset error signal based on a DC offset voltage of an analog signal, a means for generating an analog correction signal from the analog DC offset error signal, and a means for reducing the DC offset voltage from the analog signal.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Aspects of the present disclosure describe an analog-based direct current (DC) offset voltage compensator. The analog-based DC offset voltage compensator may include an integrator to detect a DC offset voltage in an analog input signal and generate an analog DC offset error signal. The analog DC offset error signal may be amplified, inverted, and subtracted from the analog input signal to remove or reduce the DC offset voltage.

Figure 1A:
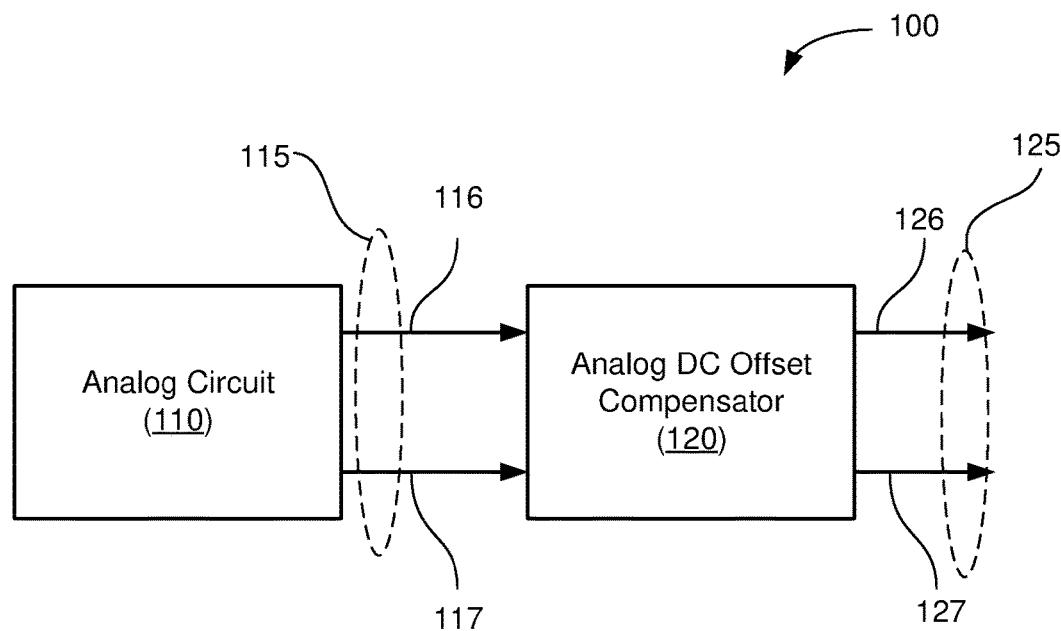
FIG. 1A shows a simplified block diagram of an analog signal processing system, in accordance with some implementations.

FIG. 1A shows a simplified block diagram of an analog signal processing system 100, in accordance with some implementations. The analog signal processing system 100 may include an analog circuit 110 and an analog DC offset compensator 120. Some implementations of the analog circuit 110 may include amplifiers, mixers, continuous time linear equalization (CTLE) circuits, or the like. Further, some implementations of the analog circuit 110 may include one or more discrete components, parts, or devices to process or generate analog signals, such as signal 115.

In some implementations, the signal 115 may be a differential signal that includes two separate signals whose difference in voltage or current can represent a magnitude or value of a signal, metric, operating characteristic, or the like. As shown, the signal 115 may include a first analog signal 116 and a second analog signal 117. In some other implementations, the signal 115 may be a pseudo-differential signal which shares some signal characteristics in common with a differential signal, but may be generated through two discrete circuits instead of through differential circuits. The analog circuit 110 may be coupled to the analog DC offset compensator 120 by the signal 115.

The analog DC offset compensator 120 may receive the signal 115, detect and remove any DC offset voltage in the signal 115, and output a compensated signal 125. In some implementations, the compensated signal 125 may be a differential or a pseudo-differential signal including a first compensated signal 126 and a second compensated signal 127. Further, the analog DC offset compensator 120 may be implemented with differential circuits, or with two or more pseudo-differential circuits. The analog DC offset compensator 120 is described in more detail below with respect to FIG. 2.

Figure 1B:
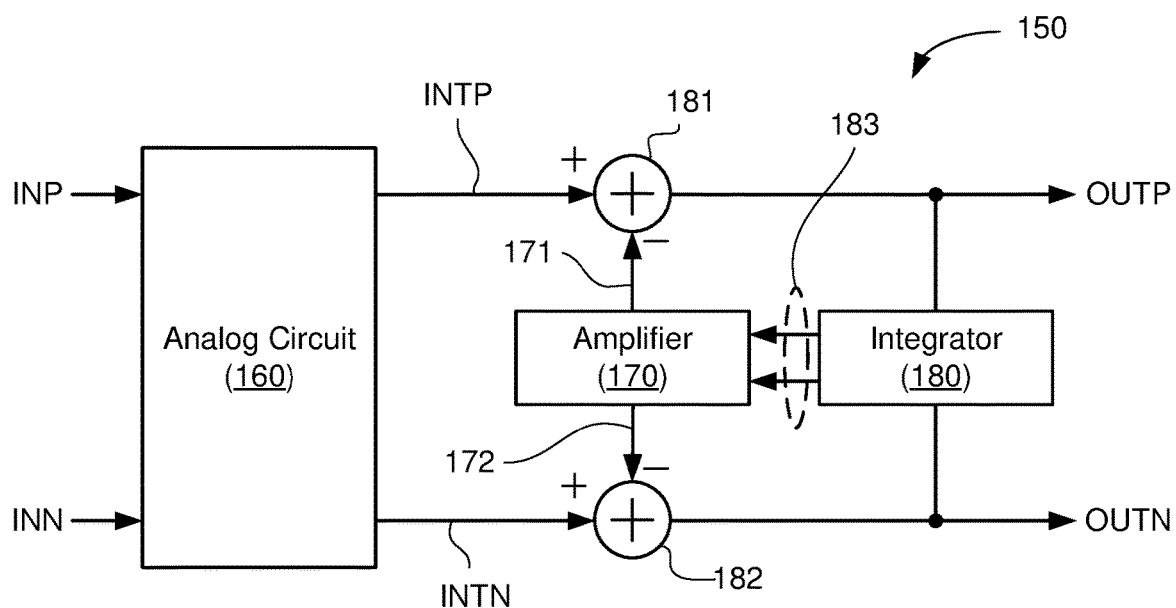
FIG. 1B is a simplified block diagram of another analog DC offset system 150.

FIG. 1B is a simplified block diagram of another analog DC offset system 150. The analog DC offset system 150 may be an implementation of the analog DC offset system 100 of FIG. 1A. The analog DC offset system 150 may generate differential signals OUTP and OUTN based on differential signals INP and INN and may include an analog circuit 160, an amplifier block 170, an integrator block 180, and summing nodes 181 and 182. The analog circuit 160 may be an implementation of the analog circuit 110.

The analog circuit 160 may receive the signals INP and INN. The analog circuit 160 may amplify, attenuate, buffer, or otherwise process the INP and INN signals and generate intermediate differential signals INTP and INTN. The intermediate differential signals INTP and INTN may be received by the summing nodes 181 and 182, respectively. The summing node 181 may generate the OUTP signal by subtracting the amplifier signal 171 from the INTP signal. Similarly, the summing node 182 may generate the OUTN signal by subtracting the amplifier signal 172 from the INTN signal.

The integrator block 180 and the amplifier block 170 together form a feedback system to detect and subtract or reduce DC offset signals from the INTP and INTN signals. Because the INTP and INTN signals are based on the INP and INN signals, the integrator block 180 and the amplifier block 170 may also subtract or reduce DC offset signals from the INP and INN signals.

The integrator block 180 may detect the presence of a DC offset in the OUTP and OUTN signals. In some implementations, the integrator block 180 may include a low-pass filter (not shown for simplicity) to detect DC offset signals. Thus, the integrator 180 may generate error signals 183 corresponding to the DC offset of the OUTP and OUTN signals. The error signals 183 are received by the amplifier block 170. The amplifier block 170 may amplify the error signals 183 to reduce or cancel the DC offset signals. In some implementations, the amplifier block 170 may generate analog correction signals 171 and 172 based on processed (e.g., amplified, buffered, or attenuated) error signals 183. The analog correction signal 171 may be subtracted from the INTP signal at the summing node 181 and the analog correction signal 172 may be subtracted from the INTN signal at the summing node 182.

Although described herein with respect to differential signals, persons skilled in the art will recognize that aspects of the analog DC offset system 150 may also apply to pseudo-differential or single-ended signals.

Figure 2:
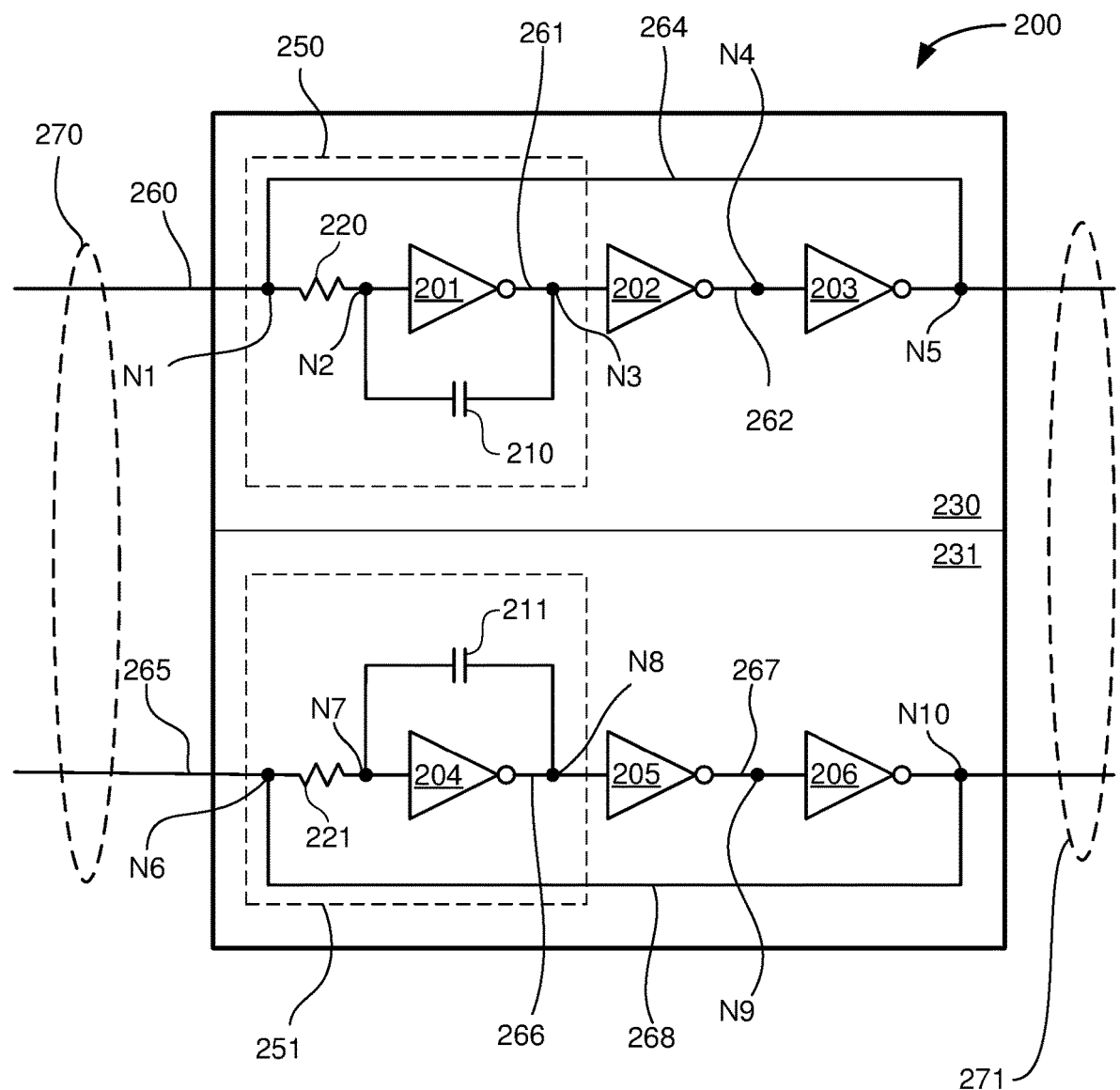
FIG. 2 is a simplified schematic diagram of an analog DC offset compensator, in accordance with some implementations.

FIG. 2 is a simplified schematic diagram of an analog DC offset compensator 200, in accordance with some implementations. The analog DC offset compensator 200 may be an implementation of the analog DC offset compensator 120 of FIG. 1 and may include inverting buffers 201-206, capacitors 210 and 211, and resistors 220 and 221. The inverting buffers 201-206 are shown as inverters and may be implemented with one or more discrete components, circuits, devices, or the like configured to provide inverting buffer functionality. In some implementations, the inverting buffers 201-206 may be implemented with inverting amplifiers configured to function as an amplifier with negative gain.

The analog DC offset compensator 200 may include a first section 230 and a second section 231. As shown, the first section 230 may be independent from (e.g., have no connections or coupling with) the second section 231 and vice versa. That is, the first section 230 may be separate and isolated from the second section 231. In this manner, differential signals received by the analog DC offset compensator 200 may be processed as pseudo-differential signals.

The first section 230 may receive a first analog signal 260 through a first integrator 250 and node N1. The first integrator 250 may detect and measure a DC offset voltage of the first analog signal 260 and generate a first analog DC offset error signal 261 at node N3. The magnitude of the first analog DC offset error signal 261 may be proportional to the amount of DC offset voltage in the first analog signal 260.

The first integrator 250 may include resistor 220, inverting buffer 201, and capacitor 210, and may integrate the first analog signal 260 to generate the first analog DC offset error signal 261. The resistor 220 may include a first terminal coupled to node N1 and a second terminal coupled to an input of the inverting buffer 201 at node N2. The capacitor 210 may include a first terminal coupled to node N2 and a second terminal coupled to an output of the inverting buffer 201 which is coupled to an input of the inverting buffer 202 at node N3. The inverting buffer 202 may amplify and invert the first analog DC offset error signal 261 and output a first analog correction signal 262 at node N4. Thus, the inverting buffer 202 may provide the first analog correction signal 262 proportional to the analog DC offset voltage in the first analog signal 260. The inverting buffer 203 may amplify and invert the first analog correction signal 262 received at node N4.

The inverting buffers 201-203 form a feedback path in the first section 230, while a feed-forward path 264 may be implemented with a wire, a metal layer, conductive silicon, or the like. Note that due to the odd number of inverting buffers 201-203 in the feedback path, the detected and scaled first analog DC offset error signal 261 may be subtracted from the first analog signal 260 (provided by the feed-forward path 264) at node N5. In some aspects, the capacitor 210 and the resistor 220 of the first integrator 250 may provide low-pass filter functionality. Thus, high frequency signals associated with the first analog signal 260 are blocked or attenuated through the inverting buffers 202-203, limiting signals in the feedback path to low frequency signals, such as signals related to a DC offset voltage. The blocked or attenuated high-frequency signals may be determined by values of the capacitor 210 and the resistor 220. The gain of the feedback path may be "tuned" to adjust negative feedback provided by the inverting buffers 201-203 to reduce and/or remove the DC offset voltage in the first analog signal 260

Similar to the first section 230, the second section 231 may include a second integrator 251 and receive a second analog signal 265 through node N6. The second integrator 251 may detect and measure a DC offset voltage of a second analog signal 265 and generate a second analog DC offset error signal 266 at node N8. The magnitude of the second analog DC offset error signal 266 may be proportional to an amount of DC offset voltage in the second analog signal 265.

The second integrator 251 may include resistor 221, inverting buffer 204, and capacitor 211, and may integrate the second analog signal 265 to generate the second analog DC offset error signal 266. The resistor 221 may include a first terminal coupled to node N6 and a second terminal coupled to an input of the inverting buffer 204 at node N7. The capacitor 211 may include a first terminal coupled to node N7 and a second terminal coupled to an output of the inverting buffer 204 which is coupled to an input of the inverting buffer 205 at node N8. The inverting buffer 205 may amplify and invert the second analog DC offset error signal 266 and output a second analog correction signal 267 at node N9. Thus, the inverting buffer 205 may provide the second analog correction signal 267 proportional to the DC offset voltage in the second analog signal 265. The inverting buffer 206 may amplify and invert the second analog DC offset error signal 266 received at node N9.

The inverting buffers 204-206 form a feedback path in the second section 231, while a feed-forward path 268 may be implemented with a wire, a metal layer, conductive silicon, or the like. Note that due to the odd number of inverting buffers 204-206 in the feedback path, the detected and scaled analog DC offset error signal is subtracted from the second analog signal 265 (provided by the feed-forward path 268) at node N10. The capacitor 211 and the resistor 221 of the second integrator 251 may provide low-pass filter functionality. Thus, high-frequency signals associated with the second analog signal 265 are blocked or attenuated from the inverting buffers 205-206, limiting signals in the feedback path to low frequency signals, such as a DC offset voltage signals. The blocked or attenuated high-frequency signals may be determined by values of the capacitor 211 and the resistor 221.

As described above, the first section 230 may operate independently of the second section 231. In some implementations, the first section 230 may be used to reduce or remove a DC offset voltage associated with a single-ended signal. For applications involving only single-ended analog signals, the second section 231 may be left unused or excluded from the analog DC offset compensator 200.

In some implementations, the analog DC offset compensator 200 may receive differential or pseudo-differential signals. For example, the analog DC offset compensator 200 may receive a differential or pseudo-differential signal 270 that includes the first analog signal 260 and the second analog signal 265. In some aspects, each signal from the differential or pseudo-differential input signal 270 may be processed independently by the first section 230 and the second section 231 of the analog DC offset compensator 200. Further, output signals from the inverting buffer 203 and the inverting buffer 206 may form a differential or pseudo-differential output signal 271. In this manner, the analog DC offset compensator 200 may reduce or remove a DC offset voltage from the differential or pseudo-differential input signal 270 and provide a compensated differential or pseudo-differential output signal 271.

Figure 3:
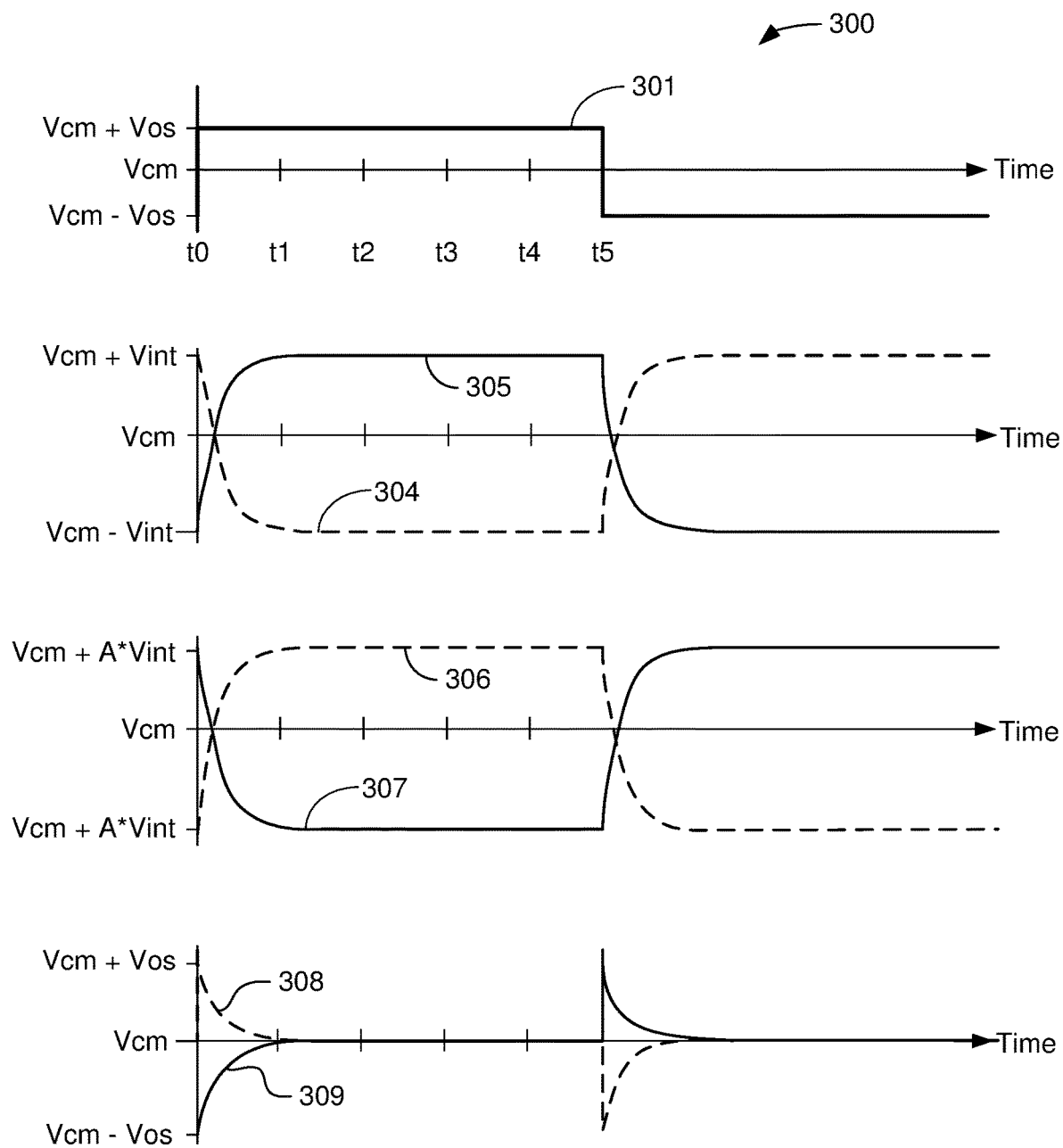
FIG. 3 is a diagram showing example waveforms associated with the analog DC offset compensator of FIG. 2.

FIG. 3 is a diagram 300 showing example waveforms associated with the analog DC offset compensator 200 of FIG. 2. The waveforms herein show voltages associated with possible operating points of the analog DC offset compensator 200. Other operating points, and therefore other voltages and waveforms are possible.

Waveform 301 shows an example DC offset voltage that may be received by the analog DC offset compensator 200 at nodes N1 and N6. More particularly, the waveform 301 shows a single-ended signal centered around an arbitrary voltage Vcm having a positive or negative offset voltage Vos. Those skilled in the art will appreciate that a differential signal based similar to the waveform 301 may be received at the nodes N1 and N6 with the signal at each node having an opposite offset voltage Vos (not shown here for simplicity). As shown, at time t=t0, the DC offset voltage transitions from −Vos to +Vos.

The inverting buffer 201 may integrate a DC offset voltage at the node N1 based on the resistor 220 and the capacitor 210 and generate the first DC offset error signal 261 at node N3. The voltage at node N3 is shown as dashed waveform 304. Similarly, the inverting buffer 204 may integrate a DC offset voltage at the node N6 based on the resistor 221 and the capacitor 211 and generate the second DC offset error signal 266 at node N8. The voltage at node N8 is shown as waveform 305. In some implementations, magnitude of the signals at node N3 and node N8 may be related to the amount of DC offset voltage detected at nodes N1 and N6 and the gain of the inverting buffers 201 and 204, respectively. The magnitude of the signals at the nodes N3 and N6 are denoted Vint+Vos and Vint−Vos.

The inverting buffer 202 may invert and amplify the voltage of node N3, and generate a voltage at node N4, shown as dashed waveform 306. Similarly, the inverting buffer 205 may invert and amplify the voltage of node N8, and generate a voltage at node N9, shown as waveform 307. The dashed waveform 306 may correspond to the first analog correction signal 262 and waveform 307 may correspond to the second analog correction signal 267. The amount of amplification (also referred to as gain) provided by the inverting buffer 202 and/or the inverting buffer 205 may be denoted as A. In some implementations, the amount of gain of the inverting buffer 202 and the inverting buffer 205 may be determined through simulation in order to effectively remove or reduce the DC offset voltage of the first analog signal 260 provided to the node N1 and the second analog signal 265 provided to node N6. In this example, the magnitude of the waveforms 306 and 307 may be Vcm+A*Vint and Vcm−A*Vint, respectively.

The output from the inverting buffers 202 and 205 may be amplified and inverted by the inverting buffers 203 and 206, respectively. The output of the inverting buffer 203 may be subtracted from the first analog signal 260 and the output of the inverting buffer 206 may be subtracted from the second analog signal 265 to remove or reduce DC offset voltages present in the first analog signal 260 and second analog signal 265, respectively. The output voltage of the inverting buffer 203 at node N5 is shown as dashed waveform 308. The output voltage of the inverting buffer 206 at node N10 is shown as waveform 309. The offset voltages Vos and −Vos may be removed from signals received by the analog DC offset compensator 200. As shown, the response time of the analog DC offset compensator 200 may be between time periods t0 and t1. In some aspects, response time of the analog DC offset compensator may be determined at least in part by values of the resistor 220, 221 and capacitor 210, 211 values.

Figure 4:
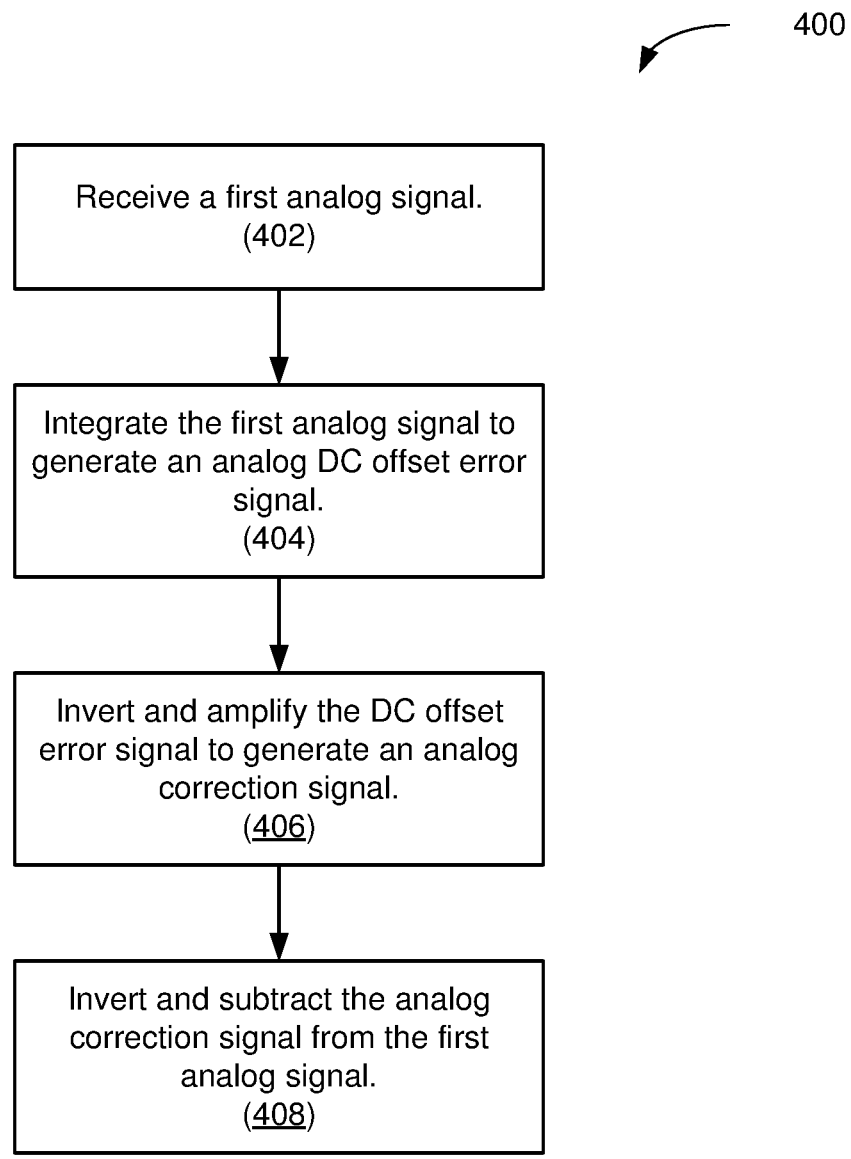
FIG. 4 shows an illustrative flowchart depicting an example operation for operating an analog DC offset compensator, in accordance with some implementations.

FIG. 4 shows an illustrative flowchart depicting an example operation 400 for operating an analog DC offset compensator, according to some implementations. The operation 400 is described below with respect to the first section 230 of the analog DC offset compensator 200 of FIG. 2 for illustrative purposes only. The operation 400 may be used to operate the second section 231, or any other feasible analog DC offset compensator. In some implementations, the operation 400 may be used to operate the first section 230 and the second section 231 concurrently The operation 400 may begin by receiving the first analog signal 260 (402). The first analog signal 260 may include a DC offset voltage. In some implementations, the first analog signal 260 may be received by an integrator, such as the first integrator 250.

Next, the first analog signal 260 may be integrated to generate an analog DC offset error signal 261 (404). Next, the first analog DC offset error signal 261 may be inverted and amplified to generate the first analog correction signal 262 (406). In some implementations, an inverter buffer (such as inverting buffer 202) may receive, invert, and amplify the first analog DC offset error signal 261 to generate the first analog correction signal 262.

Next, the first analog correction signal 262 may be inverted and subtracted from the first analog signal 260 (408). In some implementations, inverting and subtracting the first analog correction signal 262 from the first analog signal 260 may reduce or remove a DC offset voltage from the first analog signal 260.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An analog direct current (DC) offset compensator comprising:
an integrator configured to generate an analog DC offset error signal based on a DC offset voltage of an analog signal, wherein the integrator includes:
a resistor having a first terminal to receive the analog signal and a second terminal coupled to an input of a third buffer; and
a capacitor having a first terminal coupled to the second terminal of the resistor and a second terminal coupled to an output of the third buffer, wherein the output of the third buffer is to generate the analog DC offset error signal;
a first buffer configured to invert and amplify the analog DC offset error signal to generate an analog correction signal; and
a second buffer configured to invert and subtract the analog correction signal from the analog signal to reduce the DC offset voltage in the analog signal.

2. The analog DC offset compensator of claim 1, wherein the third buffer is configured to invert the analog DC offset error signal.

3. The analog DC offset compensator of claim 1, wherein the integrator is configured to attenuate high-frequency signals in the analog DC offset error signal.

4. The analog DC offset compensator of claim 3, wherein the attenuated high-frequency signals are determined at least in part by values of the resistor and the capacitor.

5. The analog DC offset compensator of claim 1, wherein the second buffer is configured to remove the DC offset voltage from the analog signal.

6. The analog DC offset compensator of claim 1, wherein a gain of the first buffer is selected to cancel the DC offset voltage.

7. A differential analog direct current (DC) offset compensator comprising:
a first compensation circuit including:
a first integrator configured to generate a first analog DC offset error signal based on a first DC offset voltage of a first analog differential signal;
a first buffer configured to invert and amplify the first analog DC offset error signal to generate a first analog correction signal; and
a second buffer configured to invert and subtract the first analog correction signal from the first analog differential signal to reduce the first DC offset voltage in the first analog differential signal; and
a second compensation circuit including:
a second integrator configured to generate a second analog DC offset error signal based on a second DC offset voltage of a second analog differential signal;
a third buffer configured to invert and amplify the second analog DC offset error signal to generate a second analog correction signal; and
a fourth buffer configured to invert and subtract the second analog correction signal from the second analog differential signal to reduce the second DC offset voltage from the second analog differential signal.

8. The differential analog DC offset compensator of claim 7, wherein the first integrator comprises a fifth buffer to generate the first analog DC offset error signal based on the first analog differential signal.

9. The differential analog DC offset compensator of claim 8, wherein the first integrator comprises:
a first resistor having a first terminal to receive the first analog differential signal and a second terminal coupled to an input of the fifth buffer; and
a first capacitor having a first terminal coupled to the second terminal of the first resistor and a second terminal coupled to an output of the fifth buffer.

10. The differential analog DC offset compensator of claim 9, wherein the first integrator is configured to attenuate high-frequency signals in the first analog DC offset error signal.

11. The differential analog DC offset compensator of claim 10, wherein the attenuated high-frequency signals in the first analog DC offset error signal are determined based at least in part by values of the first resistor and the first capacitor.

12. The differential analog DC offset compensator of claim 9, wherein the second integrator comprises a sixth buffer to receive the second analog differential signal and provide the second analog DC offset error signal.

13. The differential analog DC offset compensator of claim 12, wherein the second integrator further comprises:
a second resistor having a first terminal to receive the second analog differential signal and a second terminal coupled to an input of the sixth buffer; and
a second capacitor having a first terminal coupled to the second terminal of the second resistor and a second terminal coupled to an output of the sixth buffer.

14. The differential analog DC offset compensator of claim 13, wherein the second integrator is configured to attenuate high-frequency signals in the second analog DC offset error signal.

15. The differential analog DC offset compensator of claim 14, wherein the attenuated high-frequency signals in the second analog DC offset error signal are determined based at least in part by values of the second resistor and the second capacitor.

16. The differential analog DC offset compensator of claim 12, wherein the fifth buffer and the sixth buffer are configured to invert the first analog DC offset error signal and the second analog DC offset error signal, respectively.

17. An analog direct current (DC) offset compensator comprising:
means for generating an analog DC offset error signal based on a DC offset voltage of an analog signal using a resistor and a capacitor, wherein:
the resistor includes a first terminal to receive the analog signal, and includes a second terminal coupled to an input of a third buffer; and
the capacitor includes a first terminal coupled to the second terminal of the resistor, and includes a second terminal coupled to an output of the third buffer, the output of the third buffer configured to generate the analog DC offset error signal;
means for generating an analog correction signal from the analog DC offset error signal; and
means for reducing the DC offset voltage from the analog signal.

18. The analog DC offset compensator of claim 17, wherein the means for generating the analog DC offset error signal comprises integrating the analog signal.

19. The analog DC offset compensator of claim 17, wherein the means for reducing the DC offset voltage from the analog signal comprises subtracting the analog correction signal from the analog signal.

* * * * *